(12) United States Patent
Hausmann et al.

(10) Patent No.: US 7,995,348 B2
(45) Date of Patent: Aug. 9, 2011

(54) SURGE PROTECTOR WITH A MOUNTING BASE

(75) Inventors: Ralf Hausmann, Blomberg (DE); Frank Welzel, Detmold (DE); Christina Grewe, Detmold (DE)

(73) Assignee: Phoenix Contact GmbH & Co. KG (DE)

( * ) Notice: Subject to any disclaimer, the term of this patent is extended or adjusted under 35 U.S.C. 154(b) by 609 days.

(21) Appl. No.: 12/035,620

(22) Filed: Feb. 22, 2008

(65) Prior Publication Data

US 2008/0218982 A1   Sep. 11, 2008

(51) Int. Cl.
*H05K 7/00* (2006.01)

(52) U.S. Cl. .......... 361/728; 361/118; 361/91.1

(58) Field of Classification Search .......... 361/728, 361/88, 91.1, 1, 117–120, 127, 126; 439/181, 439/92, 527, 532

See application file for complete search history.

(56) References Cited

U.S. PATENT DOCUMENTS

| 5,480,310 A * | 1/1996 | Baum | 439/94 |
| 5,797,756 A * | 8/1998 | Nad | 439/94 |
| 6,172,875 B1 * | 1/2001 | Suzuki et al. | 361/729 |
| 6,249,416 B1 * | 6/2001 | Daoud et al. | 361/119 |
| 6,431,909 B1 * | 8/2002 | Nolden et al. | 439/532 |

* cited by examiner

*Primary Examiner* — Hung S Bui
(74) *Attorney, Agent, or Firm* — Bourque and Associates, PA

(57) ABSTRACT

A surge protector includes a housing with connectors for passing through an electrical lead that is to be protected, whereby a surge voltage discharge device is located inside the housing and a mounting base for placement on a mounting rail is located on the outside of the housing. The mounting base on the housing exhibits a power surge proof discharge contact for contacting the mounting rail with the discharge contact being connected to the discharge connector of the surge protector. An attachment is connected in a removeable fashion to the mounting base which includes a contact component which contacts the discharge contact of the mounting base and is connected in an electrically conducting manner with a lead that exits the attachment.

6 Claims, 2 Drawing Sheets

SURGE PROTECTOR WITH A MOUNTING BASE

TECHNICAL FIELD

The invention relates to a surge protector with a housing that has connectors for passing through an electrical lead that is to be protected, whereby a voltage surge discharge device is located inside the housing and a mounting base for placement on a mounting rail is located on the outside of the housing. The mounting base on the housing exhibits a power surge proof discharge contact for contacting the mounting rail with the discharge contact being connected to the discharge connector of the surge voltage device.

BACKGROUND INFORMATION

Known surge protectors of the type mentioned discharge occurring voltage surges via the discharge contact of the mounting base into the metal mounting rail, which is also connected to an equalization potential such as the ground potential. Surge protectors with other designs are known that are connected directly via a cable that serves the purpose of discharging the voltage surge and that need to be connected to a locally present potential equalization device via a terminal point.

Depending on the installation conditions and the installation location, one of the two aforementioned designs for surge protectors is to be selected beforehand. Thus, the location and manner of installing the unit must already be determined when ordering the surge protector. Subsequent changes to the manner of installation, such as changing a discharge cable exiting the unit housing for rail mounting with the appropriate contacts is not possible; a different unit would be required in such cases.

SUMMARY

It is the objective of the invention to develop a surge protector of the aforementioned type, where the decision about the manner of installation can be made at the installation location and thus one and the same unit can be adapted for different installation conditions by the user.

This objective is achieved with a surge protector of the aforementioned type by having a removeable attachment connect to the mounting base that exhibits a contact component which contacts the discharge contact of the mounting base and is electrically connected with a lead that exits the attachment.

It is important for the invention to be able to change at the place of installation the shipped design, to change at that point where the discharge of the voltage surge is carried out via the lead that exits the attachment to the design that is placed on the support rail, and where the discharge of the voltage surge to the mounting rail is carried out via the discharge contact of the mounting base which is also used to mount the lead. The required change-over is very simple because only the removeable attachment that is connected to the mounting base of the unit housing must be removed, which is particularly easy to accomplish if a mechanical catch device is used with which the rail-mountable design is affixed to the mounting rail.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Figure 1:
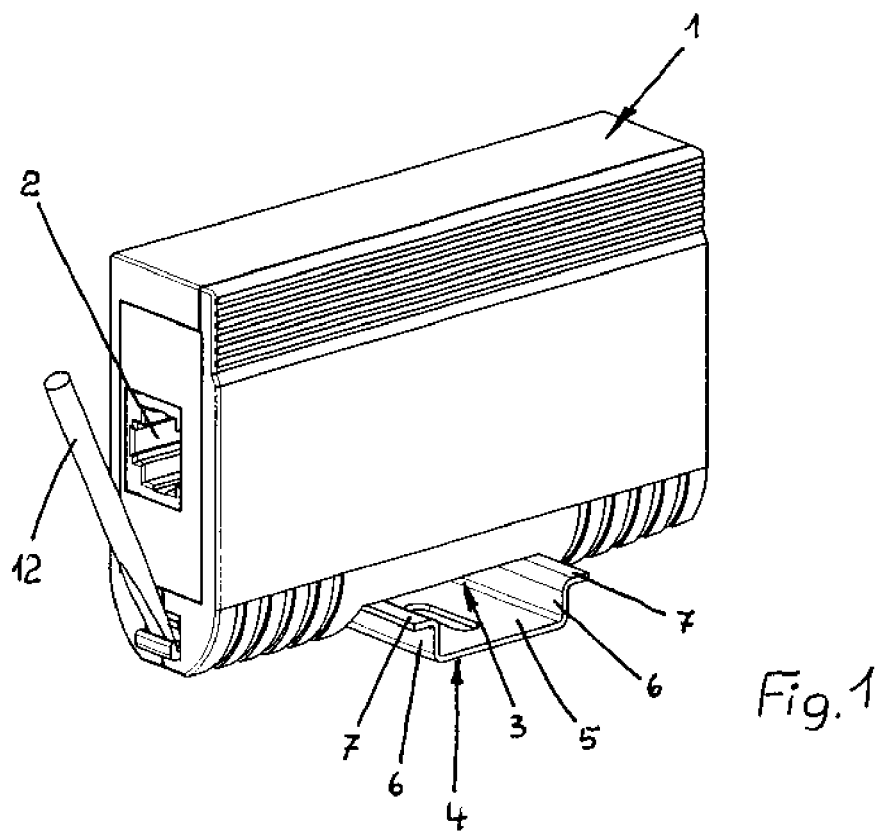
FIG. 1 is a perspective view of a surge protector placed on a mounting rail.
Figure 2:
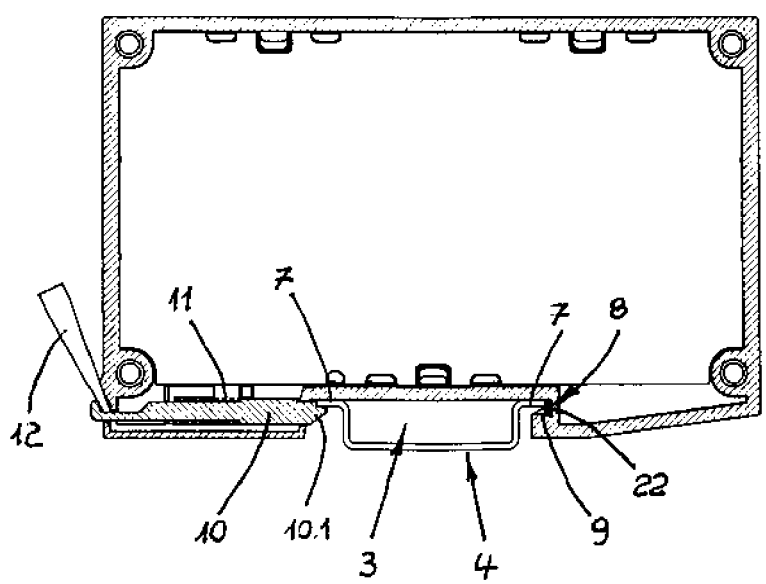
FIG. 2 shows a longitudinal section through the unit according to FIG. 1.

In detail, FIGS. 1 and 2 show a housing 1 of a surge protector, which essentially exhibits a flat design with a rectangular base. At the narrow sides opposite to one another, the housing 1 is provided with terminals 2, which are used to connect an electric lead that is to be protected but is not shown in the drawing. This lead passes through the housing 1 and inside is connected to a surge voltage discharge device, which, as usual, can be designed in various ways and is, therefore, well known in the prior art and also not shown in the drawing. At one of its other narrow sides, the housing 1 features a mounting base 3, which does not protrude; rather it is designed in the form of an indentation of the housing side. Using the indented mounting base 3, the housing 1 can be placed to or onto a mounting rail 4. The mounting rail 4 is a typical top hat rail that exhibits a U-shaped cross-section in its central area.

From the longitudinal sides of a base bar 5, parallel flange bars 6 are angled, and each of these flange bars 6 is bent towards the outside creating support webs 7 at the mounting bar 4, which are located in one common plane.

As is apparent from FIG. 2, the indented mounting base 3 is defined on one of its sides by a housing wall 8, which has in the direction of the indentation an undercut-type open receiving contour 9 in the shape of a slot or a molded in groove. On the side opposite the housing wall 8, the mounting base 3 is defined by a catch slide 10, which is supported at the housing 1 and movable from the shown position in the direction away from the receiving contour 9. Using a compression spring 11, the catch slide 10 aims at assuming the end position located toward the receiving contour 9. It can be moved out of this position using a tool blade 12. At the end that is directed towards the receiving contour 9, the catch slide 10 is provided with a latch 10.1 that is equipped with a run-on slope on its outer side.

In the mounted position shown in FIG. 2, the housing 1 rests on the support webs 7 of the mounting rail 4 with its indented mounting base 3. One of the two support webs 7 engages in the receiving contour 9 and the second support web 7 is held by the latch 10.1 of the catch slide 10 from below.

The receiving contour 9 of the support base 3 is not only used for mechanically securing the surge protector on the mounting rail 4 but the walls of this receiving contour 9 are also designed as a power surge proof discharge contact 22. On the inside of the housing 1, the discharge contact 22 is connected to the surge protector discharge device (not shown) via the discharge connector.

Figure 3:
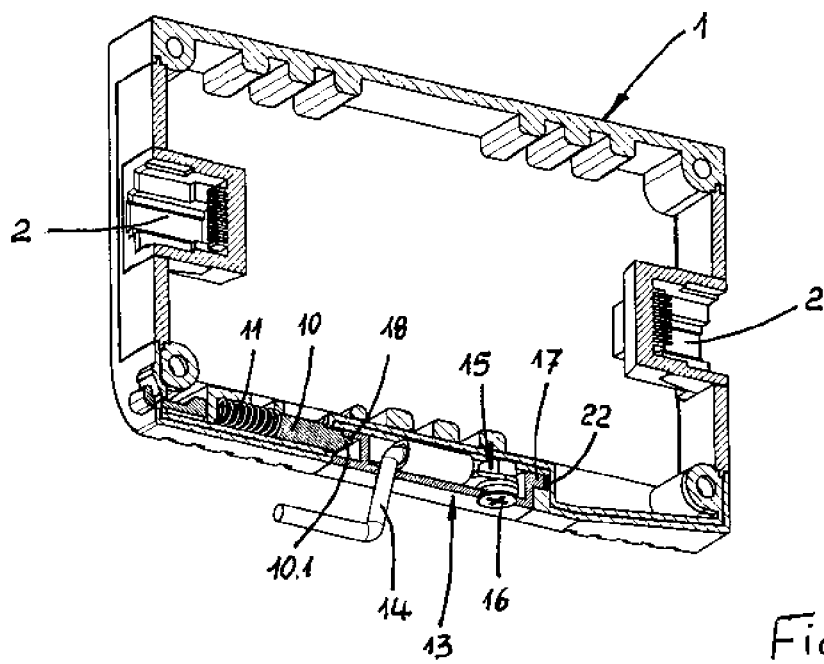
FIG. 3 shows a longitudinal section in perspective representation through the unit according to FIG. 1 and FIG. 2 in a design intended for a different type of mounting.
Figure 4:
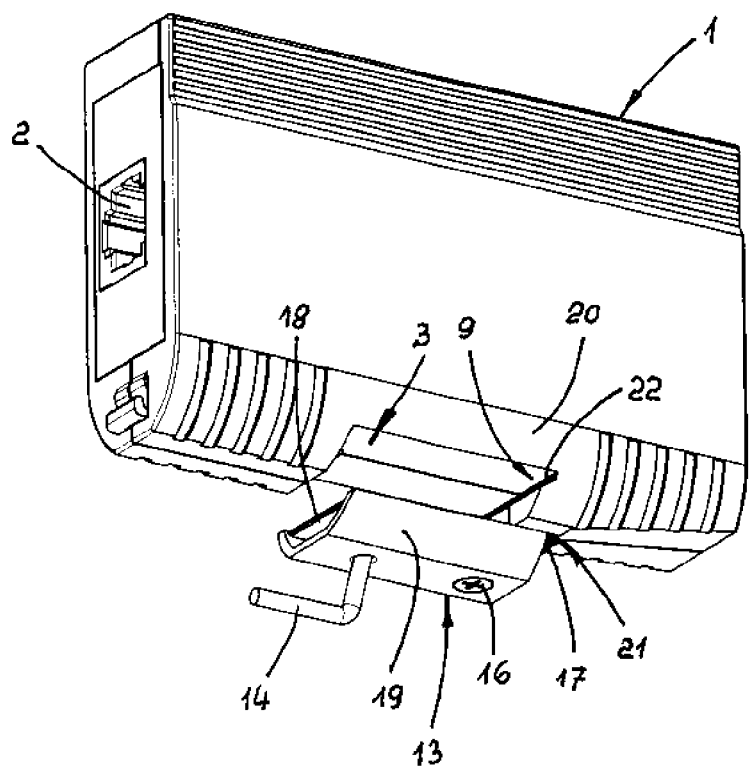
FIG. 4 shows a perspective representation of the entire unit according to FIG. 3 with the attachment shown in a removed view.

FIGS. 3 and 4 show the same surge protector which cannot only be mounted on the mounting rail but is also designed for a second manner of mounting in its initial state. To this end, an attachment 13 is connected to the mounting base 3 of the housing 1, and in a preferred embodiment is designed as a positive fit insert in the indented mounting base 3. Exiting from the attachment 13 is a lead 14, which is connected to a terminal point at equalization potential outside the surge protector. On the inside of the attachment 13 is a terminal point 15 with a terminal screw 16, and via this terminal point 15, a metal, i.e., electrically conducting, connection is established to a contact component 21, which is exposed on the outside at the attachment 13.

The contact component 21 is part of a fastening web 17 that protrudes at the one face end of the attachment 13 and engages in the receiving contour 9 of the mounting base 3 at the housing 1 to secure the attachment 13. Correspondingly, the support web 17 is positive fit to the receiving contour 9, and in the same manner as the receiving contour 9 in its entirety can form the discharge contact 22, the fastening web 17 of the attachment 13 in its entirety can form the contact component 21 in order to contact the discharge contact 22 at the housing 1.

At the face end that points away from the fastening web 17, the attachment 13 exhibits an inner, metal bar 18 with an exposed end section 18.1, which is preferably in a metal, electrically conducting connection with the terminal point 15 of the attachment 13. The free end section 18.1 of this second attachment web 18 of the attachment 13 reaches behind the latch 10.1 of the catch slide 10 when in the position of the attachment placed into the mounting base 3, as shown in FIG. 3. In cases when the catch slide 10 is also connected to the discharge connection of the surge protection device in the housing 1 and is made of metal, a portion of the voltage surge can be discharged via the catch slide 10, the attachment 13 and the lead 14.

In similar fashion as the entire unit can be snapped onto the mounting rail 4 via the mounting base 3, the attachment 13 can be engaged in the indented mounting base 3 of the housing 1. From the factory, the surge protector is shipped with the attachment engaged, and the attachment 13 is removed from the housing 1, whenever the surge protector requires mounting on a rail like the mounting rail 4.

Modifications and substitutions by one of ordinary skill in the art are considered to be within the scope of the present invention, which is not to be limited except by the allowed claims and their legal equivalents.

The invention claimed is:

1. A surge protector with a housing with connections for passing through an electrical lead that is to be protected, whereby a surge voltage discharge device is located in the housing and on the outside of the housing a mounting base to be snapped onto a mounting rail is located, and whereby the mounting base includes a power surge proof discharge contact that is connected to a discharge connection of the surge voltage device, for contacting the mounting rail, wherein an attachment (13) is removably connected to the mounting base (3) in a removable manner that includes a contact component (21) which contacts the discharge contact (22) of the mounting base (3) and that is connected in an electrically conducting manner with a lead (14) that exits from the attachment (13), wherein a discharge of a voltage surge is carried out via the lead (14) that exits the attachment (13), characterized in that by removal of the attachment (13), the surge protector is configured to be changed into a rail-mountable design, wherein the discharge of the voltage surge to a mounting rail (4) is carried out via the discharge contact (22) of the mounting base (3).

2. The surge protector as set forth in claim 1, wherein the mounting base (3) which is designed on the housing (1) to be placed onto a mounting rail (4) which is formed in the shape of a top hat rail, the mounting rail including first and second support webs (7) that are toward an outside region adjacent to one or more flange bars (6) and having a generally overall U-shaped cross-section and which are at the same level, whereby the mounting base (3) is provided with a spring-loaded catch slide (10) that can be moved against a force of a spring (11) and when in the mounting position, supports the first support web (7) of the mounting rail (4) from underneath, and opposite said catch slide (10) is provided with a receiving contour (9) for engaging of the second support web (7) of the mounting rail (4) and whereby the attachment (13) is equipped with fastening rods (17, 18) that correspond in their function to the support webs (7) of the mounting rail (4).

3. The surge protector as set forth in claim 2, wherein the receiving contour (9) of the mounting base (3) that is located opposite the catch slide (10) and is designed like an undercut and at the base of which the discharge contact (22) of the mounting base (3) is located, whereby the contact component (21) that contacts the discharge contact (22) of the mounting base (3) is located at the fastening rod (17) of the attachment (13) that reaches into the receiving contour (9).

4. The surge protector as set forth in claim 3, wherein the receiving contour (9) of the mounting base (3) is formed entirely as a discharge contact (22) and wherein the fastening rod (17) at the attachment (13) is formed entirely as a contact component (21).

5. The surge protector as set forth in claim 1, wherein the housing (1) includes on one of its sides an indentation that forms the mounting base (3) in which the attachment (13) is inserted.

6. The surge protector as set forth in claim 5, characterized in that the attachment (13) includes an outer wall (19) that is flush adjacent to the outside (20) of the housing (1).

* * * * *